United States Patent [19]

Kumar et al.

[11] Patent Number: 4,888,675
[45] Date of Patent: Dec. 19, 1989

[54] SWITCHING POWER SUPPLY FILTER

[75] Inventors: Prithvi R. Kumar, Melbourne; Wayne Abare, West Melbourne, both of Fla.

[73] Assignee: Harris Corporation, Melbourne, Fla.

[21] Appl. No.: 89,469

[22] Filed: Aug. 26, 1987

[51] Int. Cl.[4] .............................................. H02M 1/14
[52] U.S. Cl. ...................................... 363/47; 333/181
[58] Field of Search ....................... 363/44, 45, 46, 47, 363/48, 126; 333/181-185

[56] References Cited

U.S. PATENT DOCUMENTS

| | | | |
|---|---|---|---|
| 3,340,458 | 9/1967 | Keller | 321/10 |
| 3,378,752 | 4/1968 | Naylor | 363/40 |
| 3,683,271 | 8/1972 | Kobayashi | 323/76 |
| 3,731,234 | 5/1973 | Collins | 333/1 |
| 3,996,537 | 12/1976 | Neuman | 333/78 |
| 4,081,770 | 3/1978 | Mayer | 333/181 X |
| 4,126,840 | 11/1978 | Selvin | 333/182 X |
| 4,222,096 | 9/1980 | Capewell | 363/126 X |
| 4,369,490 | 1/1983 | Blum | 363/126 X |
| 4,408,171 | 10/1983 | Akino et al. | 333/181 X |
| 4,475,209 | 10/1984 | Udren | 375/4 |
| 4,544,899 | 10/1985 | Townsend et al. | 333/17 R |
| 4,563,659 | 1/1986 | Sakamoto | 333/181 |
| 4,571,561 | 2/1986 | Fujiki et al. | 333/185 X |
| 4,683,529 | 7/1987 | Bucher, II | 363/44 |
| 4,760,231 | 7/1988 | Hayashi | 363/47 X |
| 4,777,455 | 10/1988 | Sakamoto et al. | 331/181 X |

OTHER PUBLICATIONS

Kamm, "Predicting and Controlling EMI in State-of-the-Art Power Converters", Professional Advancement Seminar, May, 1979, pp. 1–20.
IBM Technical Disclosure Bulletin, Vol. 29, No. 10, March, 1987, p. 4437.
Common-Mode Noise Generation in a DC-T.-DC Converter, Power Conversion International, Nov.–Dec., 1979, pp. 20–26.
Guide for Common-Mode Filter Design, Coilcraft, Inc., 1985, pp. 1–10.

Primary Examiner—Patrick R. Salce
Assistant Examiner—Kristine Peckman
Attorney, Agent, or Firm—John L. DeAngelis, Jr.

[57] ABSTRACT

A filter for a switching power supply. The filter includes a common mode inductor with coil configurations allowing differential mode current from a dc source to pass through but attenuating common mode noise from the power supply so that the noise does not reach the dc source. The invention also includes the use of feed through capacitors at the switching power supply input terminals to provide further high-frequency noise attenuation.

4 Claims, 3 Drawing Sheets

SWITCHING POWER SUPPLY FILTER

This invention was made with Government support under NASA Contract 18300. The Government has certain rights in this invention.

FIELD OF THE INVENTION

This invention relates to power supply filters for filtering high frequency noise generated by switching power supplies or dc-dc converter.

BACKGROUND OF THE INVENTION

In many applications, especially in the aircraft avionics environment, one of the primary power sources available is dc. This primary power is converted to secondary power within the power supply of the avionics systems. Dc-dc converter (also referred as a switching power supply) is a switching device that converts dc voltage to a square wave ac voltage. The square wave ac voltage may then be transformed to the desired voltage level and rectified to obtain dc in the power supply, or the square wave voltage may be used to directly operate ac devices. The square wave is preferred in converters, over the universally used sine wave in power distribution equipment, because of the much greater efficiency obtainable from switching devices operating in a square wave mode. Further, many ac devices intended for operation from sine waves, including rotating machinery, will operate satisfactorily with a square wave input.

Dc-dc converters are also widely used in applications where ac power is available, but where the magnetic components required in circuits operating at these ac frequencies would be prohibitively large and heavy. Again, the aircraft environment is especially suited for converter applications. Converters operating in the kilohertz range provide a substantial reduction in the size and weight of power transformers, filtering is also greatly simplified at these higher frequencies. Usually, only a small filter capacitor is required. The dc required to operate such converters is usually obtained by rectifying the available ac line voltage with a bridge rectifier, or directly from the dc primary power source thus also eliminating the need for low frequency power transformers.

Typically, dc-dc converters use semiconductor switches, either bipolar transistors or field-effect transisters to apply a dc voltage with rapidly reversing polarity to the primary winding of a transformer. A simplified converter circuit 10 is illustrated in FIG. 1. The converter circuit 10 includes two switching transistors 12 and 14 that are used in a push-pull arrangement to alternately apply a dc voltage (from a dc voltage source 11) to opposite halves of a center-tapped output transformer 16. The bases of both the transistors 12 and 14 are driven by a separate switching source, illustrated as a multivibrator timing oscillator 18, through a transformer 20. Power is delivered to the loads through the secondary winding of the transformer 16.

One well known problem associated with inverters is the leakage of high frequency currents from the output square wave signal back into the dc source. These high frequency noise signals can radiate high-frequency RF power by means of the cable supplying the power, which is then propagated to other converters or devices connected to the dc source. The problem is compounded by the constant efforts to increase the operating frequency of converters and thereby keep down the weight of the transformers (magnetics) associated with each one. Use of high-frequency HEXFET switching power supplies creates large high-frequency common-made noise signals that prior art filter designs cannot reject. For example, currently available switching power supplies or converters are operating above 60 kHz. At these high frequencies, conventional inductors are not suitable for filtering the high frequency components produced by the converters. At these high frequencies the inductor must be made much larger, creating another weight problem, and the inductor core must be made of a material other than the conventional iron to achieve suitable performance characteristics.

SUMMARY OF THE INVENTION

To prevent the common mode noise from the switching power supply from reaching the dc source, an especially acute problem at higher frequencies, the present invention utilizes a common mode inductor with a pair of feed through capacitors to filter the high frequency noise produced by the converter or switching power supply. The common mode inductor and the feed-through capacitors are used in an embodiment that allows the dc current to pass in to the switching power supply, but blocks the high frequency noise from entering the dc source.

BRIEF DESCRIPTION OF THE DRAWINGS

The present invention can be more easily understood, and the further advantages and uses thereof more readily apparent, when considered in view of the description of the preferred embodiments and the following figures in which.

DESCRIPTION OF THE PREFERRED EMBODIMENTS

Figure 1:
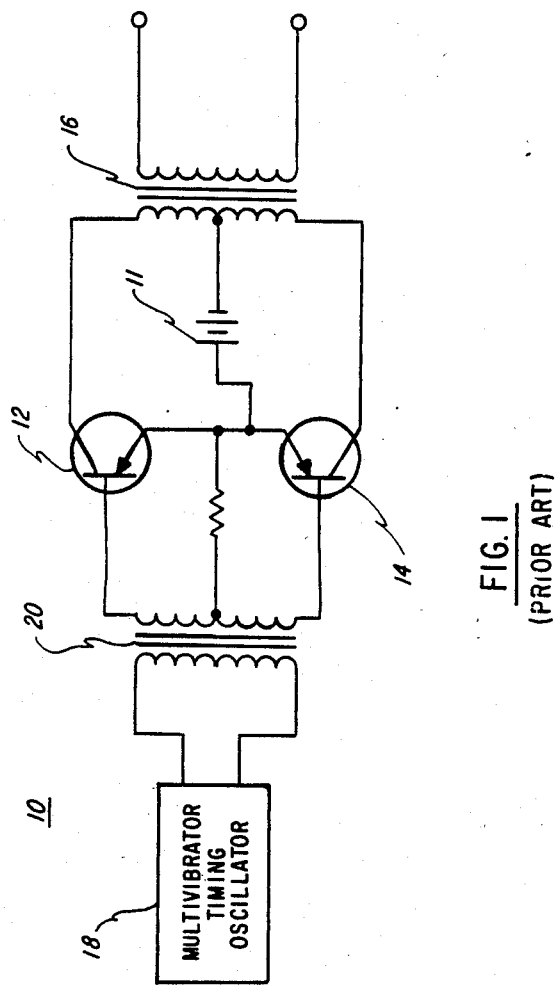
FIG. 1 depicts a prior art inverter.
Figure 2:
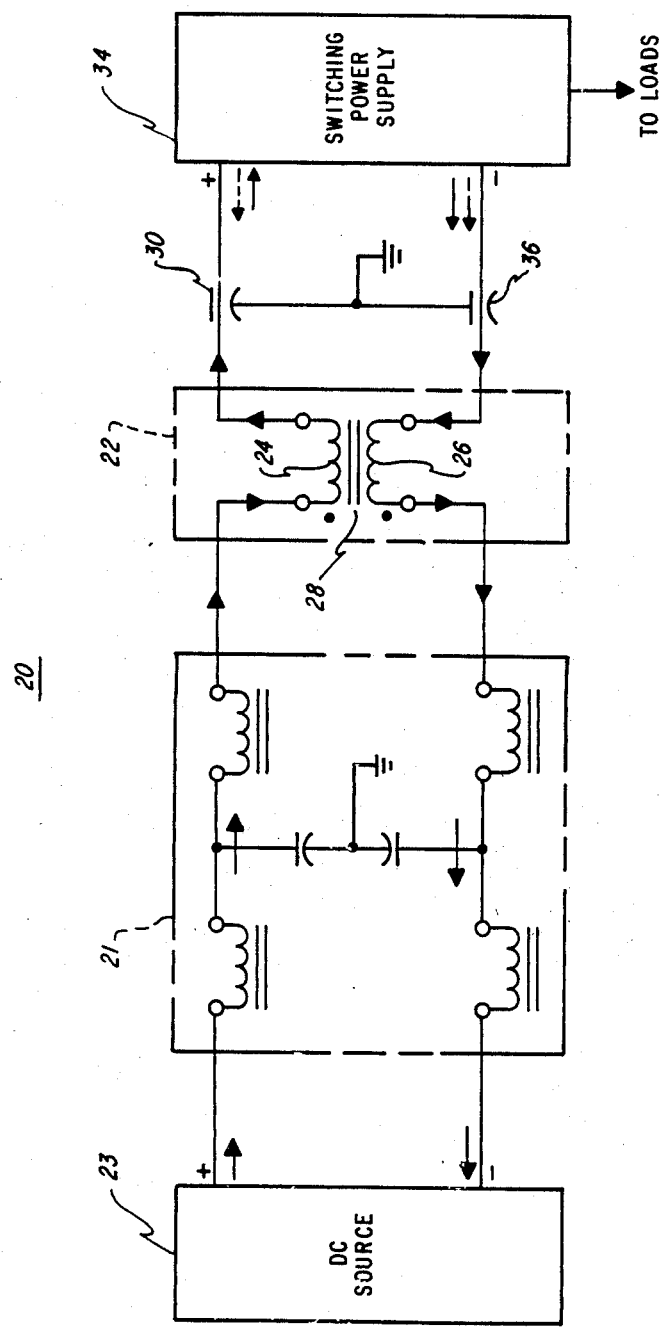
FIG. 2 is a first embodiment of a switching power supply filter constructed according to the teachings of the present invention.

FIG. 2 illustrates, in schematic form, a switching power supply filter 20. The switching power supply filter 20 includes a filter 21 connected to a dc source 23. The output terminals of the filter 21 are connected to input terminals of a common mode inductor 22. The common mode inductor 22 includes a first coil 24, a second coil 26, and a core 28. One output terminal of the common mode inductor 22 is connected to a positive input terminal of a switching power supply 34 via a feed-through capacitor 30. A second output terminal of the common mode inductor 22 is connected to a negative input terminal of the switching power supply 34 via a feed through capacitor 36. FIG. 2 illustrates the feed-through capacitors 30 and 36 in schematic form; each feed-through capacitor 30 and 36 is a three-terminal device having one terminal connected to an output terminal of the common mode inductor 22, a second terminal connected to an input terminal of the switching power supply 34, and a third terminal, which is actually the feed-through capacitor case, connected to ground.

In operation, dc current is supplied to the switching power supply 34 in the differential mode. The flow of this differential current is indicated by the solid arrows in FIG. 2. The switching power supply 34 supplies ac square wave power to the loads as indicated, and in the process of generating this ac current produces common mode high frequency noise. The common mode signals are indicated by dashed arrows in FIG. 2. The objective of the present invention is to filter the common mode noise so that it does not appear at the dc source input terminals, while allowing the differential mode dc signal to pass unimpeded to the switching power supply 34.

The coils 24 and 26 of the common mode inductor 22 are oriented such that the flux produced by the coil 24 cancels the flux produced by the coil 26 for a differential-mode signal. For a common-mode signal, the flux produced by the coil 24 and the flux produced by the coil 26 are additive; this flux addition gives the common mode inductor 22 a high impedance for common mode signals. As a result, the coils 24 and 26 block the passage of the common mode noise from the switching power supply 34 to the dc source 23. However, the coils 24 and 26 allow the differential mode dc signal from the the dc source 23 to pass through the common mode inductor 22 to the switching power supply 34.

To further ensure the attenuation of the common mode noise produced by the switching power supply 34, it is important to use feed through capacitors 30 and 36, rather than other capacitors types with the standard well-known lead configurations. The feed-through capacitors 30 and 36 have short lead lengths and grounded cases that minimize parasitic inductance in the leads and force the high frequency current to go through the capacitor. Thus, the feed-through capacitors 30 and 36 offer low impedance to high-frequency currents by virtue of their construction. Further the filter 21, the common mode inductor 22, and the feed-through capacitors 30 and 36 are usually physically mounted in a single enclosure. The case grounding feature of the feed-through capacitors 30 and 36 can be used advantageously in this configuration to completely shield the components within the enclosure yet provide a terminal for connection to the switching power supply 34.

Without the feed through capacitors 30 and 36, high frequency noise from switching power supply 34 would leak through the coils 24 and 26 via the parasitic capacitances thereof. At higher frequencies, the parasitics capacitances become even larger and provide an increasingly better path for the high frequency noise to pass through.

In addition to the common-mode noise discussed above, the switching power supply 34 also generates low-frequency ripple differential noise, and its harmonics.

The filter 21 is used to filter these low frequency differential noise components from entering the dc source 23. These noise components cannot be sufficiently attenuated by the common-mode inductor 22. The filter 21 is two well-known T-type filters connected at their bottom terminals, with this common connection grounded.

Figure 3:
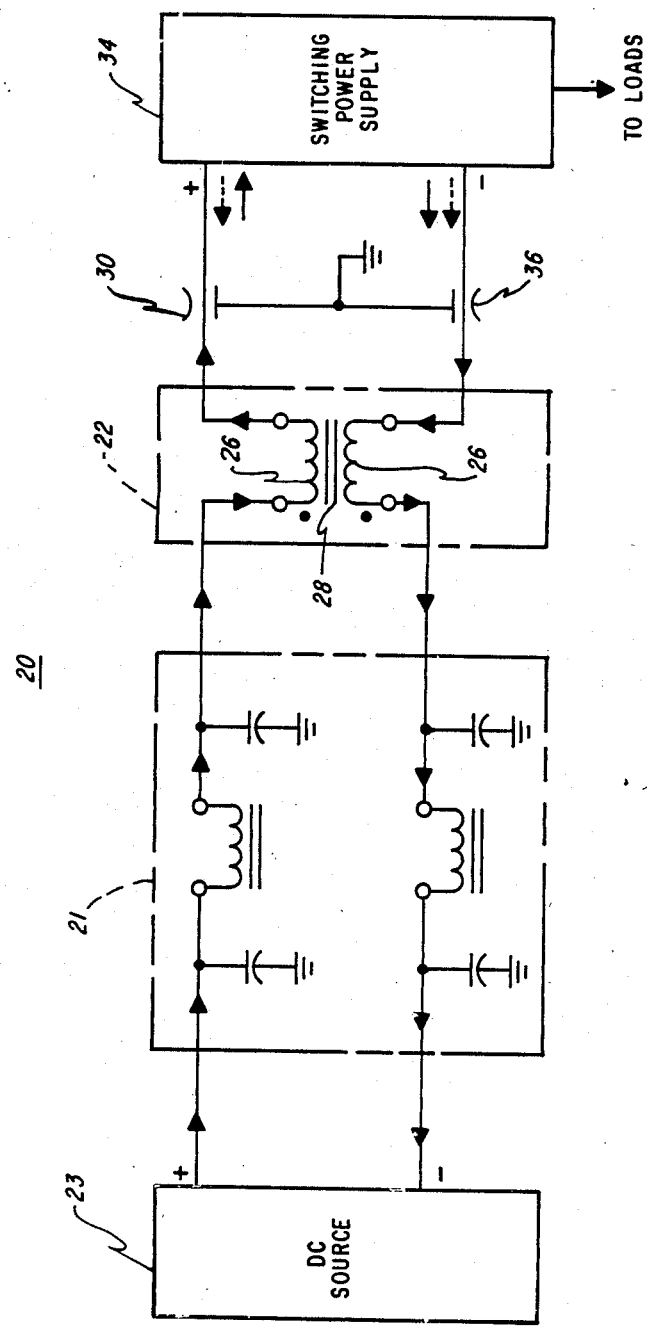
FIG. 3 is a second embodiment of a switching power supply filter constructed according to the teachings of the present invention.

FIG. 3 illustrates another embodiment of the present invention, specifically the filter 21 is illustrated as comprising two pi-type filters connected back to back. Here also, the purpose of the filter 21 is to remove all the low frequency differential noise components before they enter the dc source 23. The FIG. 3 embodiment is typically used when the noise is measured using an inductive test set-up, e.g., commercial Federal Communications Commission testing.

Although several embodiments in accordance with the present invention have been shown and described, it is understood that the same is not limited thereto, but it is susceptable of numerous changes and modifications as known to a person skilled in the art, and we therefore, do not wish to be limited to the details shown and described herein, but intend to cover such changes and modifications as are obvious to one of ordinary skill in the art.

What is claimed is:

1. A switching power supply being adapted for connection to a dc voltage source for providing an ac voltage to a load, comprising:
    an inverter for producing the ac voltage, wherein said inverter includes first and second input terminals;
    a common-mode inductor including a first coil having a first terminal connected to a first output terminal of the dc voltage source and a second coil having a first terminal connected to a second output terminal of the dc voltage source;
    a first feed-through capacitor having a first terminal connected to a second terminal of said first coil, a second terminal connected to the first input terminal of said inverter, and a third terminal connected to ground;
    a second feed-through capacitor having a first terminal connected to a second terminal of said second coil, a second terminal connected to the second input terminal of said inverter, and a third terminal connected to ground;
    wherein the dc voltage source provides dc current to said inverter, and wherein said inverter produces common-mode noise that propagates back toward the dc voltage source, and wherein said common-mode inductor presents a high impedance to the common-mode noise, and wherein said first and said second feed-through capacitors present a low impedance to the common-mode noise such that in combination with said common-mode inductor the common-mode noise is shunted to ground through said feed-through capacitors while permitting the dc current to pass therethrough.

2. The switching power supply of claim 1 including a filter disposed between the dc voltage source and the common mode inductor, for attenuating low frequency components of differential mode noise produced by the switching power supply.

3. The switching power supply of claim 2 wherein the filter includes first and second serially connected inductors connected between said first input terminal and said first output terminal, and third and fourth serially connected inductors connected between said second input terminal and said second output terminal, and first and second serially connected capacitors connected between the connection point of said first and said second inductors and the connection point of said third and said fourth inductors, and wherein the connection point of said first and said second capacitors is connected to ground.

4. The switching power supply of claim 2 wherein the filter includes a first input terminal connected to ground via a first capacitor, a first output terminal connected to ground via a second capacitor, a second input terminal connected to ground via a third capacitor, a second output terminal connected to ground via a fourth capacitor, a first inductor connected between said first input and said first output terminals, and a second inductor connected between said second input and said second output terminals.

* * * * *